United States Patent [19]

Chen

[11] 4,048,557

[45] Sept. 13, 1977

[54] PLANAR MAGNETORESISTANCE THIN FILM PROBE FOR MAGNETIC FIELD ALIGNMENT

[75] Inventor: Thomas T. Chen, Yorba Linda, Calif.

[73] Assignee: Rockwell International Corporation, El Segundo, Calif.

[21] Appl. No.: 632,735

[22] Filed: Nov. 17, 1975

[51] Int. Cl.² ............................................. G01R 33/02
[52] U.S. Cl. ................................ 324/46; 340/174 EB
[58] Field of Search ................... 324/46, 43 R, 34 B; 340/174 EB

[56] References Cited

U.S. PATENT DOCUMENTS

| 3,691,540 | 9/1972 | Almasi et al. | 340/174 EB |
|---|---|---|---|
| 3,716,781 | 2/1973 | Almasi et al. | 340/174 EB |
| 3,792,451 | 2/1974 | Almasi et al. | 340/174 EB |
| 3,858,189 | 12/1974 | Beausoleil | 340/174 EB |

OTHER PUBLICATIONS

Chang et al., Bubble Domain Analog-to-Ditigal Converter, IBM Technical Disclosure Bulletin, Dec. 1971, pp. 2218, 2219.
Walker, Magneto-Resistive Detector, IBM Technical Disclosure Bulletin, July 1972, p. 500.
Almasi, Bubble Domain Propagation and Sensing, Proceedings of the IEEE, Apr. 1973, pp. 438–444.
Almasi et al., Magnetoresistive Detector for Bubble Domains, Journal of Applied Physics, Mar. 15, 1971, pp. 1268, 1269.

Primary Examiner—Stanley T. Krawczewicz
Attorney, Agent, or Firm—H. Fredrick Hamann; G. Donald Weber, Jr.

[57] ABSTRACT

A probe for measuring the magnetic field in the plane of a magnetic device such as a magnetic bubble domain memory or the like. The probe includes a ferromagnetic, thin film element or pattern. A constant current source is connected to the ferromagnetic thin film element so that any resistance variation in the element can be sensed by measuring the voltage drop thereacross. When a magnetic field is applied in the plane of the probe, the domains in the ferromagnetic thin film element align along the direction of the magnetic field causing a magnetoresistance effect which the probe senses as a voltage change across the ferromagnetic thin film pattern. The planar magnetoresistance probe can be used to measure the amount of in-plane, d.c. field component of a perpendicularly applied bias field due to bias field misalignment. Moreover, the probe can be integrated within a magnetic device such as a magnetic bubble memory device.

13 Claims, 12 Drawing Figures

PLANAR MAGNETORESISTANCE THIN FILM PROBE FOR MAGNETIC FIELD ALIGNMENT

BACKGROUND OF THE INVENTION

1. Field of the Invention

This invention relates to field access type magnetic bubble domain devices and is particularly directed to a planar, magnetoresistance, thin film probe for measuring the magnetic field in the plane of the magnetic film.

2. Description of the Prior Art

As is well known in magnetic bubble domain devices or circuits, a magnetic bias field ($H_B$) is required to maintain the bubble domains stable in the magnetic layer. A rotating magnetic field ($H_R$) is also required to propagate the domains around the propagation tracks, e.g. the familiar T-bar, I-bar, Y-bar, chevron or similar permalloy elements arranged on the surface of the magnetic layer. The magnetic bias field is usually applied generally orthogonally to the magnetic layer. However, the bias field frequently has an associated in-plane component due to misalignment of the device package in the bias structure. In many instances, the "tilt" of the bias field is desirable and built into the device. For some component configurations, the operating margin may be sensitive to this in-plane (dc) field component. This dc field component also effects the turn-off of the rotating field. That is, any overshoot in the turn-off of the rotating field will reverse the magnetization of the permalloy elements in the memory tracks causing the magnetic domains to drift away or even collapse. By controlled tilt of the bias field, with respect to the device plane, the effect of rotating overshoot can be compensated. Reference is made, for example, to U.S. Pat. No. 3,744,042, by L. S. Cutler et al. for "Memory Protect For Magnetic Bubble Memory".

Thus, it is desirable to have precise information regarding the alignment of the bias field with respect to the device plane in order to enhance the operation of field access bubble devices.

Currently, a conventional semiconductor Hall effect probe is used for measuring the magnetic field component perpendicular to the probe surface. To measure the in-plane component due to vertical misalignment, the semiconductor Hall probe must be arranged perpendicular to the in-plane component itself. Moreover, the semiconductor Hall probe requires costly sophisticated supporting electronics, is physically not feasible to incorporate in a bubble memory system and does not exhibit sufficient sensitivity to detect small misalignments.

SUMMARY OF THE INVENTION

This invention relates to a planar, magnetoresistance probe for measuring the in-plane component of a magnetic field applied substantially perpendicular to a magnetic device plane. The probe includes a ferromagnetic thin film pattern. A constant current source is connected to the thin film pattern so that any resistance variation in the film can be sensed by measuring the voltage drop thereacross. The dimensions of the thin film are selected so that the demagnetization field of the thin film pattern is greater than its coercivity and anisotropy field. When a uniform magnetic field is applied in the plane of the film, the domains in the film begin to align along the direction of the magnetic field causing a change in the magnetoresistance effect in the ferromagnetic thin film. This change is sensed by the probe as a voltage change across the ferromagnetic thin film and is a function of the magnetic field.

The probe measures the magnetic field in the device plane in response to an oscillating in-plane field. The sensitivity of the probe can be increased by, for example, elongating the thin film pattern into a long bar. Several film patterns or bar elements can be connected in series to increase the voltage change output and to average out any non-uniform magnetization effect in each individual bar. The probe can be integrated with other magnetic bubble domain devices.

DESCRIPTION OF A PREFERRED EMBODIMENT

Figure 1:
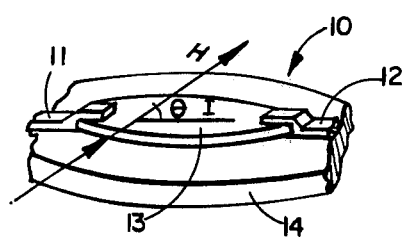
FIG. 1 is a schematic, perspective representation of a planar magnetoresistance thin film probe embodying the principles of the present invention.

Referring to FIG. 1, the basic structure of the probe 10 is illustrated. Probe 10 includes element 13 which, in a preferred embodiment, is a vacuum deposited and photolithographically defined ferromagnetic thin film pattern. Element 13 may be fabricated of permalloy or any other suitable magnetic material. Element 13 may have any desirable configuration or pattern. A generally circular or elliptical shape is illustrated. However, element 13 may take the form of an elongated bar, a chevron or any suitable shape. Element 13 is electrically connected to conductors 11 and 12, respectively. A constant current source (not shown) is connected to conductors 11 and 12. When a constant current is thereby applied to thin film 13, any resistance variation is sensed by measuring the voltage drop between the conductors 11 and 12. Element 13 is formed on layer 14 of a suitable substrate material, e.g. magnetic bubble domain material.

The dimensions of element 13 are determined so that the demagnetization field of element 13 is greater than the coercivity and anisotropy field thereof. Thus, when no external magnetic field is applied, element 13 is demagnetized and in a multiple domain state. In the demagnetized state, element 13 exhibits a certain magnetoresistance. When a uniform magnetic field H is applied to the plane of element 13, as indicated by the arrow, the magnetic domains (not to be confused with magnetic bubble domains) in pattern 13 tend to align along the direction of H. That is, the film is magnetized which causes a variation in the magnetoresistance of element 13. This magnetoresistance variation is sensed as a voltage change ΔV across permalloy film element 13 and is a function of the in-plane applied field.

Figure 2:
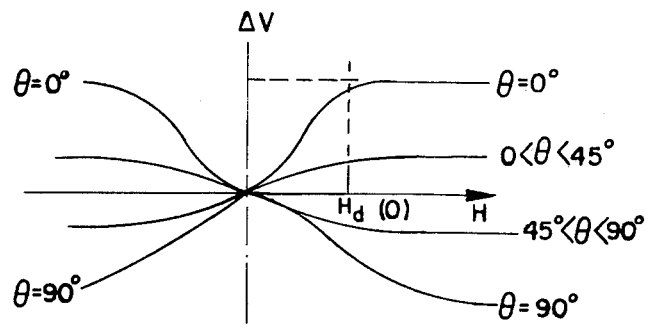
FIG. 2 is a diagram illustrating the magnetoresistance effect in the probe as a function of the in-plane applied field.

Referring to FIG. 2, there is shown a graphic representation of the relationship between the voltage change (ΔV) and the applied field (H). When the applied field, H, is sufficiently greater than the demagnetization field, $H_d$, along the direction of the applied field H, the voltage change will reach a saturation value, $\Delta V_s(\theta)$, according to the relation:

$$\Delta V_s(\theta) = I\Delta R \cos^2 \theta$$

Where $I$ is the current in element 13; $\Delta R$ is the magnetoresistance of element 13; and $\theta$ is the angle between I and H in element 13. This relation is known as the planar magnetoresistance effect in a ferromagnetic film as described in a Monthly Technical Letter (Sept. 5, 1973) submitted under Contract NAS 1-12435.

Figure 3:
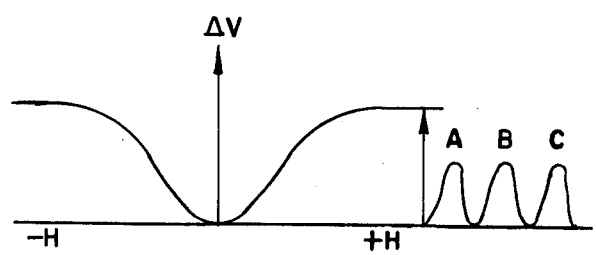
FIG. 3 is a diagram illustrating the thin film probe output waveform signal when an ac magnetic field is applied to the probe.
Figure 4:
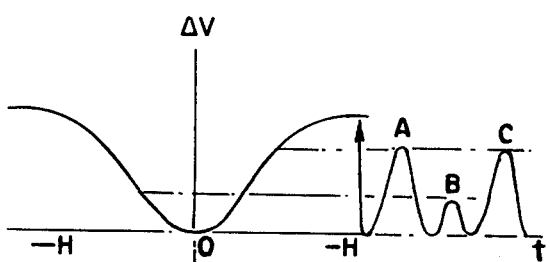
FIG. 4 is a diagram illustrating the probe output waveform signal when a biased ac magnetic field is applied to the probe.

Referring to FIG. 3, it is seen that when the applied magnetic field H is an alternating field, ΔV will oscillate at a frequency twice the frequency of H. Moreover, if H is symmetrical or uniform in shape, the ΔV output signal will have equal corresponding peaks A, B and C. If, however, an additional field ($H_{bias}$) is superimposed on H, causing an asymmetrical total field, variations in the amplitude of the ΔV waveform will be induced as illustrated in FIG. 4. Thus, with the results illustrated in FIGS. 3 and 4, the alignment of a magnetic field perpendicular to the probe can be measured by monitoring the magnetoresistance effect induced on element 13 by an in-plane oscillating field. That is, if the bias field is not exactly perpendicular to the device plane, an in-plane field component is produced in the plane of the probe. The in-plane component is a function of the misalignment of the vertical field. Variations in the voltage waveform, which can be easily observed, are produced in relation to the in-plane field component. Thus, the relationship between the vertical field and the probe device can be determined.

Figure 5A:
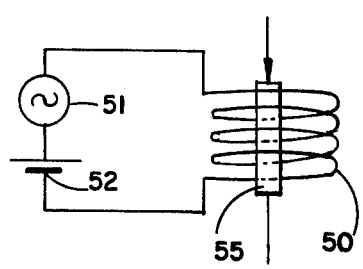
FIG. 5(a) illustrates a measuring circuit arrangement with an adjustable dc source to be used in conjunction with the present invention.
Figure 5B:
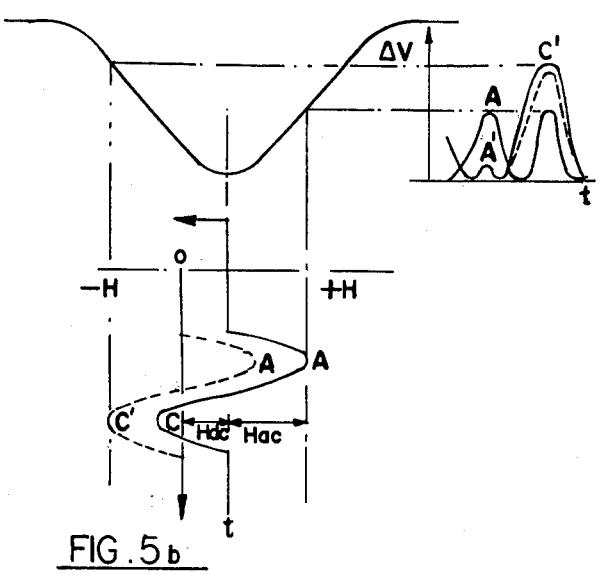
FIG. 5(b) illustrates the output waveform of a signal generated by the circuit arrangement illustrated in FIG. 5(a).

In bubble domain device operation, a controlled tilt of the bias field is frequently desirable in order to provide a d.c., in-plane holding field to stabilize the bubble domains. Therefore, a quantative measurement of d.c. field acting on the device surface is required. This determination can be accomplished by a circuit arrangement which includes field coil 50, adjustable d.c. source 52 and a.c. source 51 connected in series as shown in FIG. 5(a). Probe 55, of the type described supra, is inserted into field coil 50 and subjected to the field produced by the coil. The signal detected by probe 55 is supplied to a detector not shown for appropriate measurements. The adjustable d.c. output component produced by source 52 is superimposed on the a.c. symmetrical oscillating current produced by source 51. By adjusting the d.c. current magnitude, a compensation between the applied d.c. field in the coil, as sensed by the probe, and the d.c. component induced by bias field tilting can be determined from the symmetry of the output waveform. Thus, the amount of d.c. field due to bias tilting can be measured from the amount of d.c. current applied as illustrated in FIG. 5(b).

Figure 6:
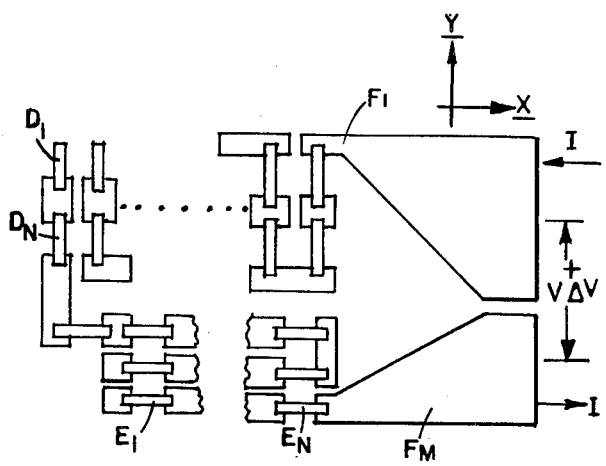
FIG. 6 illustrates one embodiment of the present invention.

Referring to FIG. 6, there is shown a schematic representation of a probe arranged in accordance with the instant invention. As noted supra, greater sensitivity can be obtained by forming film pattern 13 as an elongated bar. Alternatively, several bar elements 13 can be connected in series to increase the voltage output and also average out any nonuniform magnetization effect in each individual bar. Because of the large shape anisotropy therein, elements 13 are sensitive only to field components along the bar direction. Thus, two sets of bars, perpendicular to each other, are desirable in order to sense a randomly oriented in-plane field component. The signal from each set of bars can be displayed simultaneously simply by connecting these bars in series and using an in-plane rotating field instead of an oscillating field. The output waveform from each set of bars is shifted 90° in phase and can be separately identified. An example of this arrangement is shown in FIG. 6, where $D_1$ through $D_n$ and $E_1$ through $E_n$ are magnetic film elements similar to element 13 in FIG. 1 which corresponds $F_1$ to $F_m$ are conductor films. Typically, the field elements are about 10 μm × 50 μm × 0.5 μm and fabricated of 80-20 NiFe film or other suitable magnetizable material. The conductors may be fabricated of any suitable conductive material such as CrAu or AlCu. With these parameters, the resistance of this probe is about 6Ω. Using a 5 ma. probe current, a 1 mv. voltage variation can be measured under a 50 Oe rotating field. Assymetry of 100 μv can be easily identified in this waveform corresponds to about a 0.3 Oe in-plane component on the probe.

Figure 7:
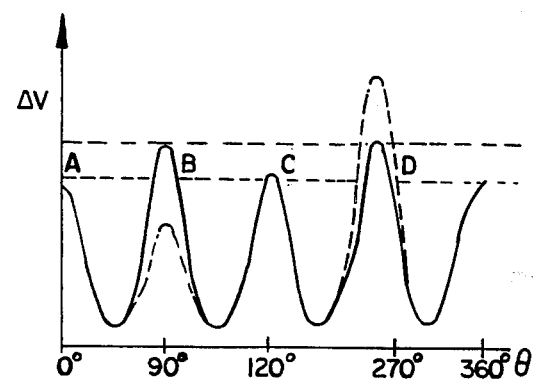
FIG. 7 illustrates a typical probe output signal from the embodiment illustrated in FIG. 6.

A typical output waveform from the embodiment shown in FIG. 6 is illustrated in FIG. 7. The peaks A and C correspond to the permalloy bars oriented in the Y direction ($D_1 - D_n$) and the B and D peaks correspond to the bars along the X axis ($E_1$-$E_n$). Any dc component along the Y axis will cause non-uniformity between the A and C peaks. Likewise, any dc component along the X axis will induce variations between the peaks B and D. Thus, depending upon the symmetry of the waveform, the orientation and magnitude of any magnetic field in the device plane can be determined.

Figure 8:
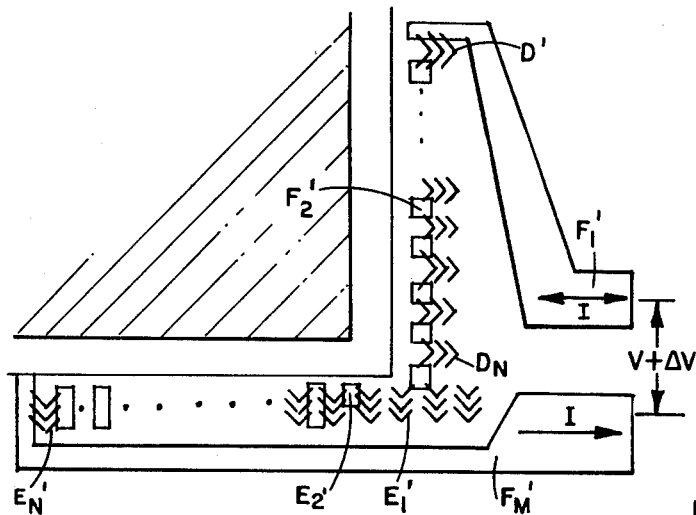
FIG. 8 illustrates another embodiment of the present invention adapted for use in a bubble domain circuit.

In another embodiment, the probe can be integrated into a bubble memory circuit. For example, as shown in FIG. 8, the chevron elements in the guard rails are connected as probe elements. In this arrangments, $D_1'$ through $D_n'$ are the vertical elements, $E_1'$ through $E_n'$ are the horizontal magnetic permalloy elements and $F_1'$ to $F_m'$ are the conductor films. In the usual manner, current is supplied through conductor films $F_1'$ to $F_m'$. This current is passed through the probe elements. The output signal v + ΔV is detected and the in-plane signal is determined. This operation does not interfere with the typical guardrail operation relative to the other device operation.

Figure 9C:
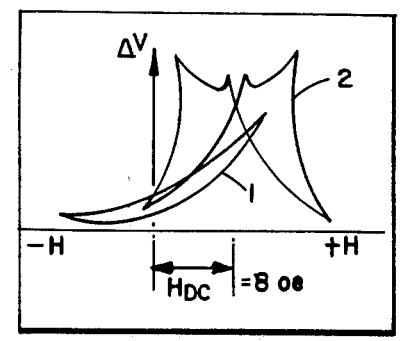
FIG. 9(c) illustrates a probe output signal from the embodiment illustrated in FIG. 9 when subject to an external dc field.
Figure 9A:
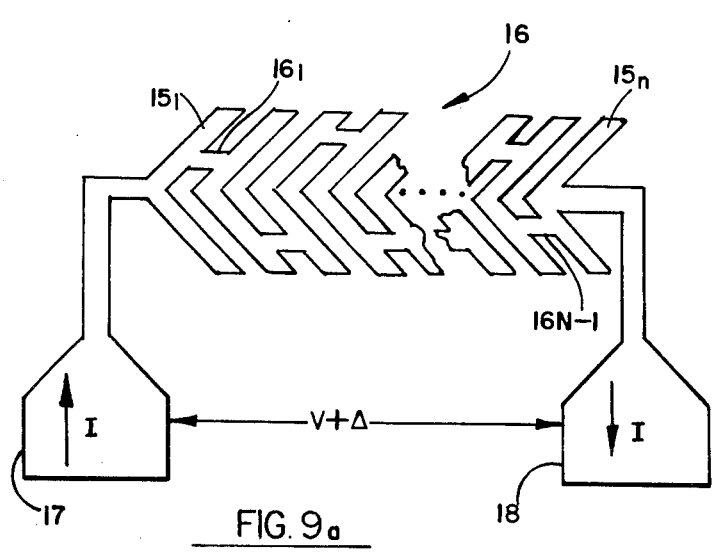
FIG. 9(a) illustrates a one level, thick film bubble detector circuit adapted to use the present invention.

Another example of such a probe structure is the one-level, thick film, bubble detector well known in the art and illustrated in FIG. 9(a). In this embodiment, the one-level, thick film, bubble detector can be utilized as a magnetoresistance probe when not functioning in the detector mode. Bubble detector 16 consists of an array of permalloy chevron elements $15_1$ through $15_N$. Chevron elements $15_1$ through $15_N$ are connected in serpentine fashion by a series of permalloy shorting elements $16_1$ through $16_{N-1}$. (Probe element 16 is a one level detector and does not include thin film conductor elements.) Current is supplied to probe 16 via permalloy elements 17 and 18. Because of shorting elements 16, the magnetoresistance of the probe is sensitive to the in-plane magnetic field in all directions. Thus, a single detector element is sufficient to check the field alignment in two perpendicular directions. Due to the complex structure, the magnetoresistance effect in this probe is also more complex than the previous embodiments discussed.

Figure 9B:
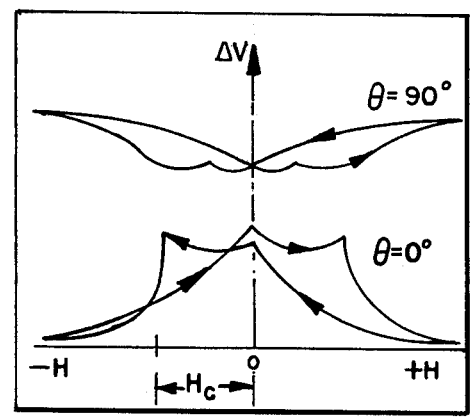
FIG. 9(b) illustrates a typical magnetoresistance probe output signal from the circuit illustrated in FIG. 9.

FIG. 9(b) illustrates a typical magnetoresistance curve taken on a 16 μm period single level, thick film detector circuit. Because of the more complicated waveform, the alignment of the bias field is more difficult to determine by the voltage (V) vs. time (t) display. Therefore, the symmetry of the probe output signal is determined by reconstructing the magnetoresistance characteristic curve on a CRT display, as illustrated in FIG. 9(b). When an external, dc, in-plane field is applied, the asymmetry in the output waveform can be easily identified.

Curve 1 in FIG. 9(c) shows the distortion due to an external field. The magnetoresistance response can be re-established to curve 2 by adjusting the dc component of the coil measuring circuit arrangement previously discussed with reference to FIG. 5. In this example, the dc field so measured is about 8 Oe.

When the measurement is determined from the symmetry of the magnetoresistance characteristics curve, the applied field has to be greater than the critical field (Hc in FIG. 9(b)) in order to establish a steady open loop curve. Then the resolution of the dc measuring field will be a fraction of Hc. In the present 16 μm period device, for 3.5 μm bubbles (detector period is 18 μm) Hc is about 10 Oe. When a resolution can be determined in the oscilloscope, then the dc magnetic field applied on the detectors can be measured to within 1 Oe.

Thus, a quantitative measurement of dc field or the degree of bias tilting on the memory device can be achieved by using a magnetoresistance device such as a bubble detector or a guardrail. Because of the complicated waveform effect from a thick bubble detector pattern, the probe is, of course, not as sensitive as the previous proposed embodiments of the invention. However, the thicker pattern can also be an integrated part of the bubble device and, therefore, offers a simple means of measuring the bias tilting in a magnetic bubble memory module.

The present magnetoresistance probe offers a simple and efficient way to align any magnetic field to be perpendicular to the device plane or to quantitatively measure the in-plane field component due to the misalignment of this field. The probe is simple in structure, small in size and can be made in an area less than 0.001 × 0.001 in. It is very inexpensive. It has high sensitivity and can resolve misalignment on the order of 0.1°. It is a low impedance device (e.g. less than 100 ohms) therefore, producing very small thermal noise. It can be used at very high frequencies. In the case of bubble memory systems, it can be integrated with the bubble memory device.

This description is intended to be illustrative only and not limitative. The scope of this invention is intended to be limited only by the claims appended hereto.

Having thus described preferred embodiments of the invention, what is claimed is:

1. In combination,
    a magnetic bubble domain structure including;
        a layer of material which is capable of forming and supporting magnetic bubble domains therein;
        a magnetizable device supported by said layer for selectively manipulating a magnetic bubble domain in said layer; and
    means for applying magnetic fields to said structure; said magnetic fields including,
        a bias magnetic field which is substantially orthogonal to said structure and is useful in forming magnetic bubble domains in said layer and which bias magnetic field may include an in-plane component which is in the plane of said device, and a propagating magnetic field which is substantially in the plane of said device and is useful in propagating magnetic bubble domains in said layer,
    the improvement comprising:
    means for detecting the in-plane component of said bias magnetic field including,
        a planar magnetoresistance effect probe for measuring the in-plane component of the bias magnetic field applied to said magnetic bubble domain structure,
        said probe formed on said layer and substantially coplanar with said device,
        said probe comprising at least one magnetic element,
        said magnetic element having dimensions such that the demagnetization field of said element is greater than the coercivity and anisotropy field thereof;
        means for supplying a constant current to said magnetic element; and
        means for producing an output voltage signal adapted for sensing and measuring the change in magnetoresistance in said magnetic element in response to a magnetic field which change in magnetoresistance is a function of the in-plane component of the bias magnetic field in the plane of said magnetic element and said magnetic bubble domain device such that any nonsymmetry in the output signal is a measure of the in-plane bias component of the bias magnetic field.

2. A device as recited in claim 1 wherein said magnetic field applied in the plane of said ferromagnetic elements is an alternating field.

3. A device as recited in claim 1 wherein said magnetic field applied in the field of said thin film ferromagnetic elements is a constant magnetic field.

4. A device as recited in claim 1 wherein said probe consists of a plurality of elements each consisting of sets of at least two elements, said sets arranged perpendicular to each other.

5. A device as recited in claim 4 wherein said sets of elements are arranged in horizontal rows and in vertical columns.

6. A device as recited in claim 1 wherein said probe consists of elements in a single level thick film detector of a bubble circuit which elements are adapted to function as a magnetoresistance effect device that is sensitive to an in-plane magnetic field in two perpencidular directions.

7. A device as recited in claim 1 wherein the misalignment of the orthogonal bias magnetic field with respect to the device plane can be measured to within 0.1° accuracy.

8. A device as recited in claim 1 wherein said at least one ferromagnetic element is arranged in the guardrails of a magnetic bubble domain memory.

9. A device as recited in claim 1 wherein each of said elements of ferromagnetic material is fabricated of permalloy material and said patterns are formed from the class of chevron, circular and bar configurations.

10. The combination recited in claim 1 wherein each said magnetic element is fabricated of ferromagnetic material and are formed from the class of chevron, circular or bar configurations.

11. A device for measuring the perpendicularity of a magnetic field which is applied to said device by measuring the component of the applied magnetic field in the plane of said device comprising:
a plurality of patterns of magnetic material each of said patterns having dimensions that assure that the demagnetization field of said patterns is greater than the coercivity and anisotropy field thereof;
said patterns connected in series to form sets of at least two patterns, said sets arranged in horizontal and vertical columns; and
conductor means connected to said patterns to pass a current through said patterns and to provide an output signal representative of the change in the magnetoresistance effect in said patterns in response to said component of the applied magnetic field whereby said component can be measured.

12. A method for quantitatively measuring the magnetic field component in a device plane comprising the steps of:
positioning a planar magnetoresistance thin film probe on the surface of said device plane;
placing a calibrated coil around said probe;
applying an a.c. signal and a d.c. signal to said coil;
monitoring the output waveform from said probe in response to said a.c. signal and said d.c. signal;
adjusting said d.c. signal to perfect a symmetrical waveform from the output wave of said probe; and
recording the measurement of said d.c. current applied to said coil.

13. The method recited in claim 12 wherein said measurement of said magnetic field is ascertained by reading the d.c. component of said driving current, determining the calibration of said coil and converting the d.c. current value to said magnetic field.

* * * * *